United States Patent [19]

Tanner et al.

[11] Patent Number: 4,769,086

[45] Date of Patent: Sep. 6, 1988

[54] THIN FILM SOLAR CELL WITH NICKEL BACK

[75] Inventors: David P. Tanner, Thousand Oaks; Theresa L. Jester, Chatsworth; Ming-Jau Yin, Newbury Park, all of Calif.

[73] Assignee: Atlantic Richfield Company, Los Angeles, Calif.

[21] Appl. No.: 2,887

[22] Filed: Jan. 13, 1987

[51] Int. Cl.⁴ .................... H01L 27/14; H01L 31/06
[52] U.S. Cl. .................... 136/249; 136/244; 136/256; 136/258; 357/30; 357/71
[58] Field of Search ............... 136/244, 249 MS, 256, 136/258 AM; 357/30 H, 30 J, 30 K, 30 Q, 71

[56] References Cited

U.S. PATENT DOCUMENTS

| 4,451,969 | 6/1984 | Chaudhuri | 437/2 |
| 4,465,575 | 8/1984 | Love et al. | 204/192.26 |
| 4,517,403 | 5/1985 | Morel et al. | 136/249 |
| 4,527,006 | 7/1985 | Yamazaki | 136/244 |
| 4,542,578 | 9/1985 | Yamano et al. | 29/572 |
| 4,584,427 | 4/1986 | Mackamul et al. | 136/256 |
| 4,665,278 | 5/1987 | Takada et al. | 136/256 |
| 4,675,469 | 6/1987 | Iida et al. | 136/259 |
| 4,697,041 | 9/1987 | Okaniwa et al. | 136/244 |

FOREIGN PATENT DOCUMENTS 59-194477 11/1984 Japan .................... 136/256

Primary Examiner—Aaron Weisstuch
Attorney, Agent, or Firm—Albert C. Metrailer

[57] ABSTRACT

A solar module of the type having at least two series connected solar cells which each include a transparent front-face electrode, a thin film photovoltaic device, and an aluminum back contact. A nickel film is provided over the aluminum back contact to provide improved resistance to degradation.

9 Claims, 1 Drawing Sheet

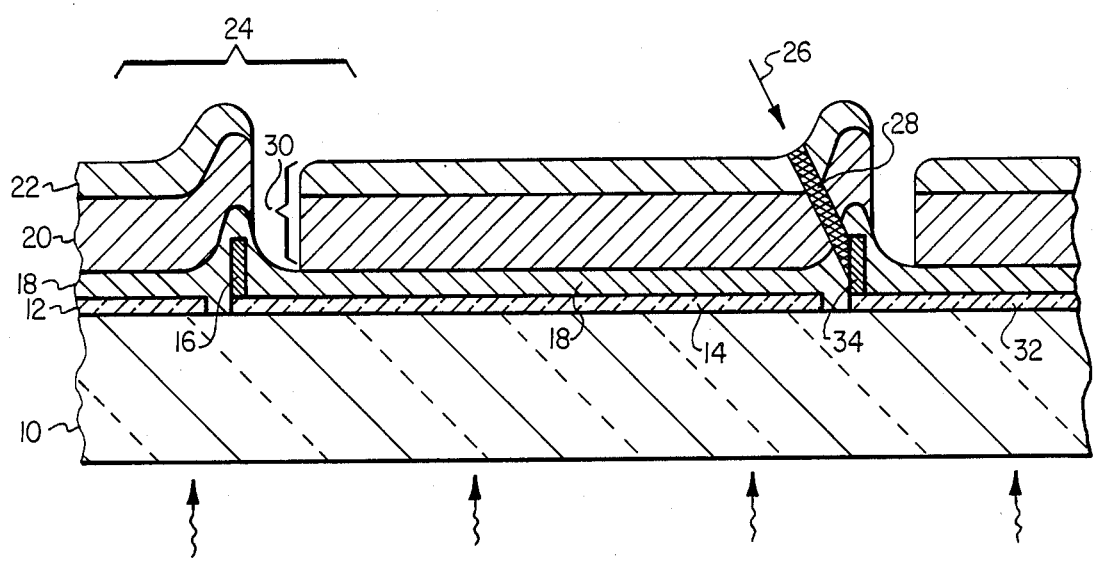

THIN FILM SOLAR CELL WITH NICKEL BACK

BACKGROUND OF THE INVENTION

This invention relates to thin film solar cells and more particularly to such solar cells having a layer of nickel on the back contact.

The following U.S. patents are incorporated by reference for all purposes: U.S. Pat. No. 4,517,403 issued May 14, 1985 and U.S. Pat. No. 4,584,427 issued April 22, 1986. These two patents provide a good background of the art of thin film solar cells and efforts made to develop commercially practical devices. For example, U.S. Pat. No. 4,517,403 illustrates commercially practical series interconnection of thin film solar cells and U.S. Pat. No. 4,584,427 provides an improvement which reduces internal resistance in individual cells. Commercially practical solar modules have been manufactured according to the teachings of these two patents. In the commercial devices, the stitch bars used to interconnect adjacent cells were formed by screen printing a paste including silver. The back contacts of cells were formed from sputtered aluminum. When this structure was scaled up to a large module, for example one foot wide by four feet long, a problem was encountered. When such large modules were tested according to Jet Propulsion Laboratory Block V test procedure, a significant reduction in module fill factor was experienced. As a result, it was apparent that some improvement to the method of manufacture or structure of the devices was needed to avoid this reduction of fill factor.

SUMMARY OF THE INVENTION

According to the present invention, we have developed an improved solar cell and module structure in which the back cell contact includes both a layer of aluminum deposited on the thin film photovoltaic device and a layer of nickel deposited on the aluminum film.

BRIEF DESCRIPTON OF THE DRAWING

The present invention may be better understood by reading the following detailed description of the preferred embodiments with reference to the accompanying single FIGURE which is a cross-sectional illustration of a portion of a thin film solar module according to the present invention.

DESCRIPTON OF THE PREFERRED EMBODIMENTS

With reference now to the FIGURE, there is illustrated a basic solar module and cell structure according to the present invention. The structure is very similar to that described in U.S. Pat. No. 4,517,403. The structure will be only briefly described herein and reference should be made to that patent for further detail.

The primary structural member of the solar module illustrated in the FIGURE is a transparent glass substrate 10. On substrate 10 there is formed a transparent conductive oxide layer 12 which may consist primarily of tin oxide. As illustrated, the layer 12 is patterned to form separate front-face electrodes for each solar cell. For example, in the center of the FIGURE a complete front-face electrode 14 is illustrated. Along one edge of the front-face electrode 14 there is formed a cell interconnect bar or stitch bar 16. An active thin film photovoltaic device is formed as layer 18. In the preferred embodiment the device is a PIN silicon device as described in U.S. Pat. No. 4,584,427 and a hydrogen glow step is used after the P layer deposition to reduce part of Contact 14. Back contacts include a first layer of aluminum 20. Layer 20 may be from 1000 to 5000 angstroms thick and is preferably about 2000 angstroms thick. In accordance with the present invention the back contacts also include a layer 22 of nickel formed over film 20. Nickel layer 22 may be from 500 angstroms to 5000 angstroms thick and is preferably about 1200 angstroms thick. Layer 22 is preferably deposited by DC magnetron sputtering immediately after deposition of aluminum layer 20. The layer 22 is then patterned at the same time as layer 20. After patterning, the structure would be as illustrated at 24.

Front-to-back electrode interconnection is preferably completed by application of a laser beam in the direction indicated by arrow 26. In practice the contact bar 34 is much thicker than illustrated and the laser beam is applied at essentially 90° to the substrate surface. This laser heating causes fusion of the region 28. The illustrated fused region 28 is highly conductive and provides an interconnection between the back contact 30 including both the aluminum and nickel films 20 and 22 and the front contact 32 of the adjacent cell through stitch bar 34.

Solar panels constructed as illustrated in the FIGURE and a described above were tested according to the Jet Propulsion Laboratory Block V program and exhibited no degradation. The exact cause of the problem and the reason for the performance improvement are unknown. There are several possible explanations.

The Jet Propulsion Laboratory Block V test program includes, among other tests, aging at 85° C. and 85 percent relative humidity. It also includes 200 temperature cycles between −40° C. and +80° C. We believe the degradation resulted from the temperature cycling and possibly the high humidity condition which may have affected the devices even though they were sealed between two glass sheets. The reduction in fill factor which occured during the test indicates that series resistance was increased at some point in the structure. It is possible that a combination of high temperature and humidity caused some type of interaction between the aluminum film 20 and some portion of the stitch bar material 34, possibly the silver.

The precise mechanism for improvement of the structure by adding the nickel layer 22 is also unknown. It is possible that the nickel film 22 provides an improved seal to moisture over aluminum film 20. This explanation assumes, of course, that it is the presence of water vapor which caused increased resistance in the first place. It may also be possible that the presence of nickel in the fused region 28 produces a more stable alloy which, therefore, does not degrade as a result of the environmental testing program.

While the layer 22 has been described as a nickel layer, the material used in the test devices included seven percent vanadium with the remainder being nickel. The material was deposited in a planar magnetron sputtering device such as that described in U.S. Pat. No. 4,465,575 issued Aug. 14, 1984. The inclusion of vanadium in a target eliminates magnetic characteristics of nickel which would otherwise interfere with such a sputtering process. We would prefer to use a less expensive nickel target, for example, pure nickel or an alloy of nickel and chromium.

While the present invention has been illustrated and described with respect to particular structures and method of manufacture, it is apparent that various changes and modifications may be made therein within the scope of the appended claims.

What is claimed is:

1. A solar cell comprising:
   a transparent front-face electrode,
   a thin film photovoltaic semiconductor layer on said front-face electrode,
   a back face electrode comprising a layer of aluminum directly contacting said thin film photovoltaic semiconductor layer, and,
   a layer comprising nickel on said back face electrode.

2. A solar cell according to claim 1 wherein said transparent front-face electrode is supported on a transparent insulating substrate through which incident light may be received.

3. A solar cell according to claim 1 wherein said thin film photovoltaic semiconductor layer comprises one or more layers of amorphous hydrogenated silicon or alloys thereof.

4. A solar cell according to claim 1 wherein said back-face electrode is from about 1000 angstroms to about 5000 angstroms thick.

5. A solar cell according to claim 1 wherein said layer comprising nickel is from about 500 angstroms to about 5000 angstroms thick.

6. A solar panel including at least two series connected solar cells wherein each cell includes
   a transparent front-face electrode,
   a thin film photovoltaic semiconductor layer on said front-face electrode,
   a back electrode comprising a layer of aluminum directly contacting said thin film photovoltaic semiconductor layer and a layer comprising nickel on said layer of aluminum,
   a portion of said back electrode of each cell overlapping a portion of the front-face electrode on an adjacent cell, and
   a cell interconnecting contact comprising a screen printed conductive bar positioned on that portion of each front-face electrode which is overlapped by a portion of an adjacent cell back electrode, said contact including silver.

7. A solar panel according to claim 6 wherein said back electrode aluminum layer is from about 1000 angstroms to about 5000 angstroms thick.

8. A solar panel according to claim 6 wherein said back electrode nickel layer is from about 500 angstroms to about 5000 angstroms thick.

9. A solar panel according to claim 6 wherein a portion of said back contact is fused by local heating with a portion of said cell interconnecting contact to form a low resistance connection between adjacent cells.

* * * * *